United States Patent [19]
Hofer

[11] 3,892,892
[45] July 1, 1975

[54] MASKING PROCESS WITH COLD SINK

[75] Inventor: Peter H. Hofer, Berkeley Heights, N.J.

[73] Assignee: Union Carbide Corporation, New York, N.Y.

[22] Filed: May 1, 1973

[21] Appl. No.: 356,207

[52] U.S. Cl. .................................... 427/272; 427/96
[51] Int. Cl. ............................................... B44d 1/52
[58] Field of Search ......... 117/8.5, 37 R, 38, 106 R, 117/119.2

[56] References Cited

UNITED STATES PATENTS

| | | | |
|---|---|---|---|
| 3,301,707 | 1/1967 | Loeb et al. | 117/227 |
| 3,342,754 | 9/1967 | Gorham | 260/2 |
| 3,379,803 | 4/1968 | Tittmann et al. | 264/81 |
| 3,472,795 | 10/1969 | Tittmann et al. | 260/2 |

*Primary Examiner*—Thomas J. Herbert, Jr.
*Assistant Examiner*—Bruce H. Hess
*Attorney, Agent, or Firm*—W. R. Moran

[57] ABSTRACT

A masking process for masking a defined area on the surface of a substrate which is to be coated with a coating material which can be embrittled at low temperatures which comprises positioning cold sink masking means along the edges of the defined area, coating the masked substrate with the coating material, cooling the cold sink masking means and that portion of the coating which covers the cold sink masking means to the embrittlement point of the coating material, and then tearing the coating along the embrittled edges thereof so as to remove the coating from the masked area of the coated surface.

21 Claims, 7 Drawing Figures

MASKING PROCESS WITH COLD SINK

BACKGROUND OF THE INVENTION

1. Field of the Invention

The invention relates to the coating of partially masked substrates with coatings formed from coating materials which can be embrittled at low temperatures.

2. Description of the Prior Art

Various types of coatings are applied to substrates to coat such surfaces. One type of such coating materials are those which can be embrittled at low temperatures. One class of such coating materials is the paraxylylene-polymers which are formed from a vaporous diradical which is condensed to form the polymer. These polymers are commonly employed to coat or encapsulate various types of substrates. In some applications, it is necessary to mask defined areas on certain types of substrates in order to prevent the deposition of the coating on such defined areas during the coating operation. Such substrates which must be masked for this purpose include electrical circuit boards, hybrid circuits, and electrical components and modules. It may also be necessary to mask non-electrical substrates which require a masking/demasking operation in conjunction with the use of adhesives in an assemblying operation.

The exposed electrical contacts and connectors on the surface of circuit board substrates (circuit boards) must be masked before the coating operation, and the masking must be removed by mechanical stripping before the coated substrate can then be put to its intended use. The cost incurred heretofore by the masking-/demasking process can account, in many applications, for at least about 20 to 50% of the total cost of the coating.

Such costs have curtailed, to some extent, the use of these coating materials for various coating applications which could not stand such costs. A more simplified and effective masking process was sought, therefore, in order to expand the field of use of these coating materials.

SUMMARY OF THE INVENTION

It has now been found that a relatively simple and effective masking process is provided when coating a portion of the surface of a substrate with a coating formed from a coating material which embrittles at low temperatures, by first masking, with cold sink masking means, that portion of the surface which is not to be coated, applying the coating material over the masked and unmasked surfaces of the substrate, cooling the cold sink masking means and that portion of the coating which is above the cold sink masking means to the embrittlement point of the coating material, and then tearing the coating along the embrittled edges thereof so as to remove the coating from the masked area of the coated surface.

An object of the present invention is to provide a masking process which will facilitate the use of coatings made from materials that can be embrittled at low temperatures.

DESCRIPTION OF THE PREFERRED EMBODIMENT

Figure 1:
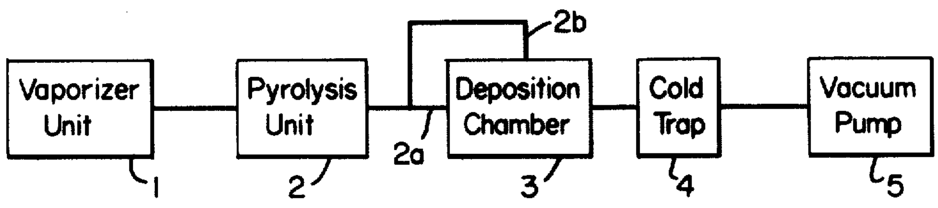
FIG. 1 shows a schematic flow sheet of a p-xylylene polymer coating device arrangement.

1. The Basic Process of the Present Invention

The basic process of the present invention may be more explicitly defined as a masking process for masking a defined area on the surface of a substrate which is to be coated with a coating material which can be embrittled at low temperatures which comprises placing masking means over such defined area, applying the coating material to the surface of the substrate so as to coat the masked and unmasked areas of such surface, cooling the coating material which overlies the masking means to a temperature and for a period of time sufficient for the embrittlement of such coating material, tearing the embrittled coating material along the edges of such defined area, and, or while, removing the masking means from the substrate.

A coating material which can be embrittled means, for the purposes of the present invention, one that suffers a loss, at a temperature of $<25$° C. to $\geq -196$° C., of about $\geq$ 125%, and preferably of at least 200%, of the elongation value it possesses at 25° C. when measured by ASTM procedure D-882-56T.

To facilitate the embrittlement of the coating material which covers the masking means, materials which can also serve as cold sinks can be used as the masking means. A "cold sink" is a material which will absorb relatively large amounts of heat without experiencing a relatively rapid rise in temperature.

The preferred of the coating materials for use in the process of the present invention are linear paraxylylene polymers, and the remaining description of the present invention will be principally based on the use of such polymers in this process.

2. General Preparation of Para-Xylylene Polymers

Linear para-xylylene polymers are usually prepared by condensing, in a condensation zone, vapors of p-xylylene monomers which can be produced by the pyrolytic cleavage, in a pyrolysis zone, of one or more cyclic dimers represented by the following structure:

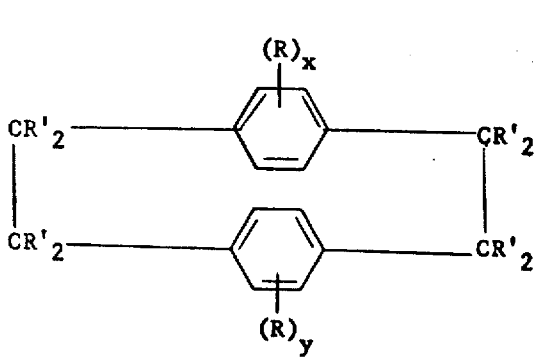

wherein R is an aromatic nuclear substituent, *x* and *y* are each integers from 0 to 3, inclusive, and R' is H, Cl and/or F. The thus formed vaporous p-xylylene moiety may be in the form of diradicals having the structures

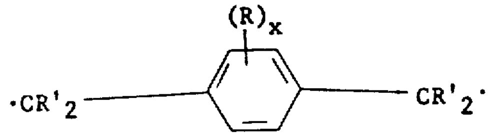

and

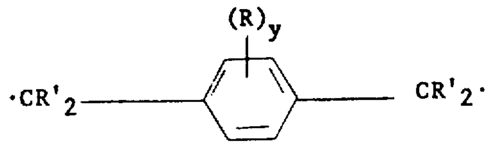

and/or moieties having the tetraene or quinoid structures:

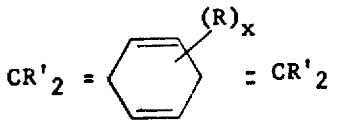

and

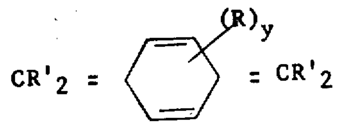

It is believed that the tetraene or quinoid structure is the dominant structure which results when the dimer is pyrolyzed, but that the monomer polymerizes as though it were in the diradical form.

Thus, where *x* and *y* are the same, and the aromatic nuclear substituent on each monomer is the same, and all the R's are the same, two moles of the same p-xylylene monomer are formed, and when condensed, yield a substituted or unsubstituted p-xylylene homopolymer. When x and y are different or the aromatic nuclear substituents on each p-xylylene monomer are different, or the R's are different, condensation of such monomers will yield copolymers as hereinafter set forth. Examples of the R substituent groups which may be present in the dimers and monomers are organic groups such as alkyl, aryl, alkenyl, cyano, alkoxy, hydroxy alkyl, carbalkoxy and like radicals and inorganic radical such as hydroxyl, halogen, and amino groups. COOH, $NO_2$ and $SO_3H$ groups may be added as R groups to the polymer after it is formed. The unsubstituted positions on the aromatic rings are occupied by hydrogen atoms.

The particularly preferred substituent R groups are the $C_1$ to $C_{10}$ hydrocarbon groups, such as the lower alkyls, i.e., methyl, ethyl, propyl, butyl and hexyl, and aryl hydrocarbons such as phenyl, alkylated phenyl, naphthyl and like groups; and the halogen groups, chlorine, bromine, iodine and fluorine. Hereinafter the term "a di-p-xylylene" refers to any substituted or unsubstituted cyclic di-p-xylylene as hereinabove discussed.

Condensation of the P-xylylene monomers to form the p-xylylene polymers can be accomplished at any temperature below the decomposition temperature of the polymer, i.e., at < 250° C. The condensation of the monomers will proceed at a faster rate, the colder is the substrate on which the condensation is to take place. Above certain temperatures, which might be defined as a ceiling condensation temperature, the monomers will condense at rates which are relatively slow for commercial applications. Each has a different ceiling condensation temperature. For example, at 0.5 mm Hg pressure the following condensation and polymerizations ceilings are observed for the following monomers:

| | Degrees centrigrade |
|---|---|
| p-Xylylene | 25–30 |
| Chloro-p-xylylene | 70–80 |
| Cyano-p-xylylene | 120–130 |
| n-Butyl-p-xylylene | 130–140 |
| Iodo-p-xylylene | 180–200 |

Thus, homopolymers may be made by maintaining the substrate surface at a temperature below the ceiling condensation temperature of the particular monomer species involved, or desired in the homopolymer. This is most appropriately termed "homopolymerizing conditions."

Where several different monomers existing in the pyrolyzed mixture have different vapor pressure and condensation characteristics as for example p-xylylene, or cyano-p-xylylene and chloro-p-xylylene, or any other mixture thereof with other substituted p-xylylenes, homopolymerization will result when the condensation and polymerization temperature is selected to be at or below that temperature at which only one of the monomers condenses and polymerizes. Thus, for the purpose of this invention the term "under homopolymerization conditions" is intended to include those conditions where only homopolymers are formed.

Therefore it is possible to make homopolymers from a mixture containing one or more of the substituted monomers when any other monomers present have different condensation or vapor pressure characteristics, and wherein only one monomer species is condensed and polymerized on the substrate surface. Of course, other monomer species not condensed on the substrate surface can be drawn through the apparatus as hereinafter described in vaporous form to be condensed and polymerized in a subsequent cold trap.

Inasmuch as the p-xylylene monomers, for example, are condensed at temperatures of about 25° to 30° C., which is much lower than that at which the cyano p-xylylene monomers condense, i.e., about 120° to 130° C., it is possible to have such p-xylylene monomers present in the vaporous pyrolyzed mixture along with the cyanosubstituted p-xylylene monomers when a homopolymer of the substituted dimer is desired. In such a case, homopolymerizing conditions for the cyano P-xylyene monomers are secured by maintaining the substrate surface at a temperature below the ceiling condensation temperature of the substituted p-xylylene but above that of the unsubstituted p-xylylene; thus permitting the unsubstituted p-xylylene vapors to pass through the apparatus without condensing and polymerizing, but collecting the poly-p-xylylene in a subsequent cold trap.

It is also possible to obtain substituted copolymers through the pyrolysis process hereinabove described Copolymers of p-xylylene and substituted p-xylylene monomers, as well as copolymers of substituted p-xylylene monomers wherein the substituted groups are all the same radicals but wherein each monomer contains a different number of substituent groups, can all be obtained through such pyrolysis process.

Copolymerization also occurs simultaneously with condensation, upon cooling of the vaporous mixture of reactive monomers to a temperature below about 200° C. under polymerization conditions.

Copolymers can be made by maintaining the substrate surface at a temperature below the ceiling condensation temperature of the lowest boiling monomer desired in the copolymer, such as at room temperature or below. This is considered "copolymerizing conditions," since at least two of the monomers will condense and copolymerize in a random copolymer at such temperature.

In the pyrolytic process, the reactive monomers are prepared by pyrolyzing a substituted and/or unsubstituted di-para-xylylene at a temperature less than about 750° C., and preferably at a temperature between about 600° C. to about 680° C. At such temperatures, essentially quantitative yields of the reactive monomers are secured. Pyrolysis of the starting di-p-xylylene begins at about 450° C. regardless of the pressure employed. Operation in the range of 450°–550° C. serves only to increase the time of reaction and lessen the yield of polymer secured. At temperatures above about 750° C., cleavage of the substituent group can occur, resulting in a tri-/or polyfunctional species causing cross-linking or highly branched polymers.

The pyrolysis temperature is essentially independent of the operating pressure. It is preferred, however that reduced or subatmospheric pressures be employed. For most operations, pressures within the range of 0.0001 to 10 mm Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

When the vapors condense on the substrate to form the polymer, i.e., coating, the coating forms as a continuous film of uniform thickness. The coatings are transparent and pinhole free. The thickness of the coating can be varied by various procedures, as by varying the amount of dimer used, and by varying the reaction temperature, time, pressure and substrate temperature.

In addition to the linear para-xylylene polymers, other coating materials which can be embrittled at low temperatures may be used in the process of the present invention.

3. Masking Means

The masking means which is used in the process of the present invention to mask those areas of the surface of the substrate which are not to be coated include all the conventional masking means such as masking tape, paper, polyethylene, vinyl resins, polytetrafluoroethylene, acetate resin, cellophane, woven tapes, foils, silicone rubber, and laminates made of resins such as epoxy resins, polyester resins and phenolic resins. These laminates may be made with or without structural reinforcing elements.

Adhesives, clamps, clips, spring loaded holders, shrinkfit devices, and the like may be used to secure the masking means to the surfaces being coated during the coating operation.

The masking means may be used in the form of thin sheets or film which are about 0.0005 to 0.20 inch thick, or in the form of thicker sleeves, templates, and the like.

Where the masking means is also used as a heat sink, the preferred heat sink materials are metals such as aluminum, copper, steel, stainless steel, brass and metal powder filled compositions based on resins such as vinyl resins and polyolefin resins.

4. Masking Process

Thus the masking process of the present invention can be more specifically defined as a process for masking a defined area on the surface of a substrate during the coating of such surface with a coating material which can be embrittled so as to prevent the coating of the defined area with the coating material which comprises applying cold sink masking means onto the defined area so as to cover such defined area, applying the coating material to the surface of the substrate so as to continuously coat the masked and unmasked areas of the surface, cooling the cold sink masking means and the coating material thereon to a temperature and for a period of time sufficient to embrittle such coating material, and tearing the embrittled coating material from the defined area, and, or while, removing the cold sink masking means from the substrate.

A more detailed understanding of the masking process of the present invention, in which para-xylylene polymers are employed, in a vapor deposition coating process, as the coating materials, may be obtained by now referring to the drawings.

FIG. 1 shows a schematic view of various parts of equipment that may be used, in combination, in carrying out the masking process of the present invention. Thus, the vaporization of the p-xylylene dimer is conducted in a vaporizer unit 1. The vapors are then conducted to a pyrolysis unit 2 for the purposes of pyrolyzing the vaporous cyclic dimer to form, per mol of dimer, two mols of the p-xylylene moiety. The p-xylylene vapors are then passed into deposition chamber 3, wherein the novel process of the present invention is essentially conducted. Unreacted p-xylylene vapors pass through deposition chamber 3 into a cold trap 4 where they are condensed. The entire series of elements 1 through 4 is connected in series to vacuum pump 5 which is used to maintain the desired pressure conditions throughout the interconnected system of devices, and also to help cause the dimer and p-xylylene vapors to flow in the desired direction. Valves may be inserted between the adjoining devices in the system to regulate the flow of the vapors.

For the purposes of the present invention the p-xylylene vapors are usually fed to deposition chamber 3 through the side thereof, through line 2*a*, and/or through the top thereof, through line 2*b*.

Figure 2:
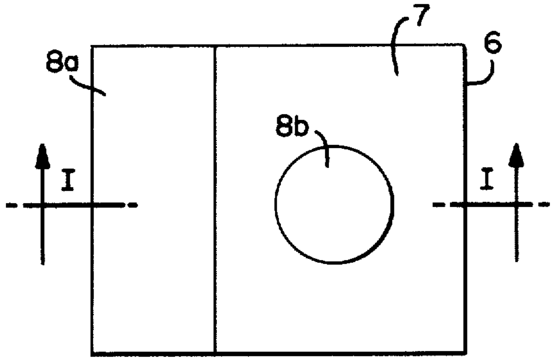
FIG. 2 shows a top view of a circuit board with a portion of the surface thereof masked in accordance with the present invention.

FIG. 2 shows a top view of a circuit board 6 having an upper surface 7. On upper surface 7 there are placed masking means 8*a* and 8*b* which also serve as cold sinks. These masking means are used to protect the underlying areas of surface 7 from being coated with paraxylylene polymer during the coating operation.

Figure 3:
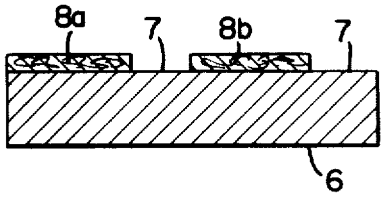
FIG. 3 shows a cross-section of the masked circuit board of FIG. 2, through section I—I thereof.

FIG. 3 shows a cross-section of circuit board 6, prior to the coating operation, through section I—I of the uncoated circuit board as seen in FIG. 2. In FIG. 3 cold sink masking means 8*a* and 8*b*, which are relatively thick (about 0.0005 to 0.030 inches) sheets of aluminum, are shown lying on the surface 7 of circuit board 6.

The surface 7 of circuit board 6 usually contains exposed electrical elements such as electrical connectors, or electrical devices such as diodes, transistors, integrated circuit chips, capacitors, resistors and the like. The existence and possible positioning of such electrical elements is not shown since it is not necessary for a proper understanding of the invention. The electrical elements which are to be coated with the coating material, however, are generally positioned within the unmasked areas of surface 7. To avoid coating such exposed electrical elements during the coating process, therefore, the surface 7 of circuit board must be masked accordingly, and the configuration of the masking means can be readily tailored to accomplish this end.

When masking means 8*a* and 8*b* are in place on surface 7, the thus assembled circuit board is coated with para-xylylene polymer in deposition chamber 3 by allowing p-xylylene dimer vapors to condense and polymerize, as disclosed above, on the exposed surface 7 of circuit board 6 and on the surfaces of masking means 8*a* and 8*b*. As a result, a continuous coating of para-xylylene polymer forms over such surfaces.

Figure 4:
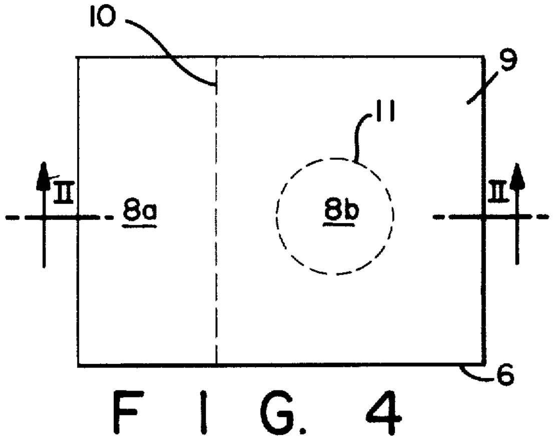
FIG. 4 shows a top view of the masked circuit board of FIGS. 2 and 3 after the coating thereof.

FIG. 4 shows a top view of circuit board 6 after such coating operation. The unmasked surface 7 of circuit board 6, as well as the surfaces of masking means 8*a* and 8*b*, are now coated with a continuous coating 9 of para-xylylene. The outlines of coated masking means 8*a* and 8*b* are shown by dotted lines 10 and 11, respectively.

Figure 5:
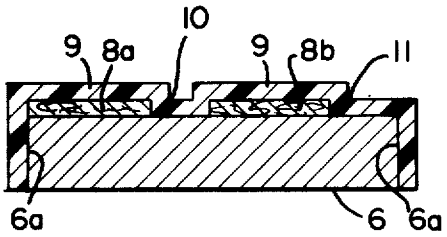
FIG. 5 shows a cross-section of the coated circuit board of FIG. 4 through section II—II thereof.

FIG. 5 shows a cross-section of the coated circuit board of FIG. 4, through section II—II thereof.

Under the usual coating conditions employed in coating substrates in a vapor deposition process with coating materials such as para-xylylene polymers, all the exposed, unmasked, surfaces of the objects being coated, top sides and/or bottom, are usually coated. In the case of circuit board 6, the bottom of it was not coated, since the bottom was not exposed to the coating vapors. The unmasked sides 6*a* of circuit board 6 were coated with coating 9 during the coating process.

After the coating is in place, that portion of it which covers the masking means is then cooled to a low enough temperature, and for a sufficient period of time, as to embrittle such coating.

The cooling can be accomplished by applying dry ice, liquid nitrogen, dry ice/acetone, freon and other liquefied gases to the coated masking means. Where the masking means is a cold sink, greater latitude is allowed in the time available to work with the cooled coating since the cold sink will maintain the cooled coating at the desired low embrittling temperature for a relatively long period of time.

Where cold sink masking means is employed the entire coated substrate can be inserted in a cooling medium to provide the desired cooling, and, when the cooled substrate is returned to room temperature that portion of the coating which is not over the cold sink masking means will warm up faster than that which covers the cold sink. Thus, that portion of the coating which is over the cold sink will still be cold enough to be brittle, while that portion which covers the substrate directly will be too warm to be brittle.

While that portion of the coating material which is over the cold sink is brittle, and the other portion of the coating is too warm to be brittle, the coating can then be readily torn off the coated substrate, as at lines 10 and 11 of FIGS. 4 and 5, at the interface between these two areas of the coating.

The coating is thus readily stripped from the masked area of the substrate leaving the unmasked area coated.

Figure 6:
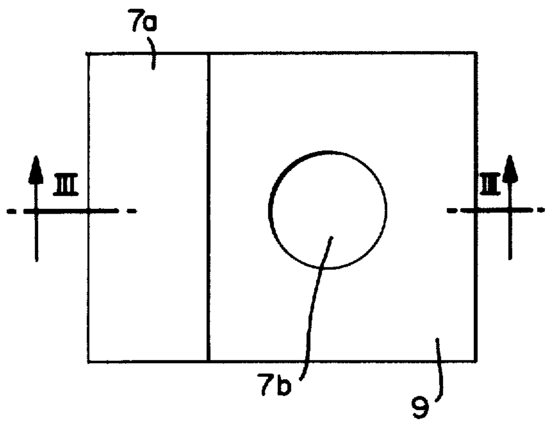
FIG. 6 shows a top view of the coated circuit board of FIGS. 2–5 after the removal of the masking means and the overlying coating.
Figure 7:
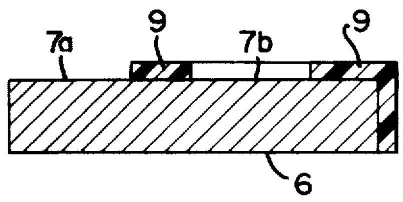
FIG. 7 shows a cross-section of the coated circuit board of FIG. 6 through section III—III thereof.

FIG. 6 shows a top view, and FIG. 7 shows a cross-section through section III—III of FIG. 6, of coated circuit board 6 after the removal of the embrittled areas of the coating and, further, after the removal of masking means 8*a* and 8*b*. Coating 9 now covers only that portion of surface 7 which was directly exposed to the coating vapors. Surface areas 7*a* and 7*b* of circuit board 6 are not coated with para-xylylene polymer, and they are those areas which were respectively covered, for the most part, by masking means 8*a* and 8*b*.

In all the drawings the relative dimensions of the elements are not drawn to scale in order to readily describe the present invention. In practice, coatings 9 are usually of the order of about 2 to 30 microns thick where para-xylylene polymers are employed as the coating materials, Thicker coatings of the order of about 100 to 250 microns, may be used with other coating materials.

The process of the present invention can thus be even more specifically defined, with respect to the use of para-xylylene polymer as the coating material, as a process for masking a defined area on the surface of a substrate during the coating of such substrate with para-xylylene polymer so as to prevent the coating of the defined area with such polymer, which comprises applying cold sink masking means to the defined area so as to cover such defined area, applying the polymer, in a vapor deposition process, as a coating over the masked and unmasked areas of the surface of the substrate, cooling the cold sink masking means and the polymer thereon to its embrittlement temperature for a period of time sufficient to embrittle such polymer, tearing the embrittled polymer from the defined area, and, or while, removing the masking means from the surface of the substrate.

7. Examples

The following examples are merely illustrative of the process of the present invention and are not intended as a limitation upon the scope thereof.

EXAMPLES 1 TO 3

A series of three experiments were conducted to illustrate the process of the present invention. For each experiment a blank circuit board substrate was masked, coated and demasked in accordance with the present invention. The substrate was a 3 inch × 8 inch × one-sixteenth inch glass fiber reinforced phenolic resin laminate which is commonly used as a circuit board substrate. The substrate was devoid of any electrical circuitry.

The masking means used in each experiment was aluminum foil tape having an adhesive on the backside thereof which allowed the tape to be adhesively bonded to the surface of the substrate during the coating operation. The tape used in Examples 1 and 3 was 2 inches wide and 0.013 inches thick, and the tape used in Example 2 was 1 inch wide and 0.005 inches thick.

In each experiment a single width of the tape, the masking means, was used to mask one of the 3 inch wide ends of the upper surface of the substrate in a position corresponding to that of masking means 8*a* as shown in FIGS. 2 and 3 of the drawings.

In each experiment the masked substrate was then placed in a para-xylylene polymer coating deposition chamber and the masked and unmasked surface of the substrate was then coated with a continuous coating of polychloro-para-xylylene which was about 0.0005 to 0.0007 inches thick.

The coating was supplied in each experiment by charging about 35 grams of chloro-para-xylylene monomer to a vaporizer unit and vaporizing and pyrolyzing the monomer, and condensing the resulting diradical on the substrate being coated in the deposition chamber, as described above. During the coating operation the following conditions prevailed in the coating apparatus in each experiment:

| | | |
|---|---|---|
| vaporizer unit temperature | : | 200°C. |
| pyrolysis unit temperature | : | 650°C. |
| deposition chamber pressure | : | 30–90 microns |
| cold trap temperature | : | −86°C. |
| vacuum pump | : | 3 microns |

After the coating operation, the coated substrates were removed from the deposition chamber and that portion of the coating which covered the aluminum tape was cooled to about −80° C. In Examples 1 and 2 the cooling was effected by placing dry ice (at −86° C.) on the coated foil for about 10 seconds, and in Example 3 the cooling was effected by dipping the masked edge of the circuit board into a mixture of dry ice and acetone (at −86° C.) for about 5 seconds. The cooling means was then removed, and the thus cooled coatings which were brittle, were readily torn along the edges of the underlying tapes, which edges correspond to edge 10 as shown in FIGS. 4 and 5 of the drawings. The coating which was directly on the substrate was not cold enough to be as brittle as the cooled coating on the masking means so that there was thereby provided a distinct tear line between the two areas of the coating.

The adhesion of the coatings which were directly on the circuit board substrates was not impaired by the removal of the coated aluminum tapes by the tearing of the coated tapes from the circuit board substrates. A clean tear line resulted from the tearing operation.

What is claimed is:

1. A process for masking a defined area on a substrate which is to be coated with a coating material which suffers a loss, at a temperature of < 25° to ≥ −196° C., of about ≥ 125% of the elongation value it possesses at 25° C., and which can be embrittled at low temperatures which comprises masking said defined area with masking means, applying said coating material to said substrate so as to coat the masked and unmasked areas of said substrate, cooling that portion of the coating material which covers said masking means to a temperature and for a period of time as is sufficient to embrittle said portions of said coating material, tearing the embrittled coating material along the edges of said defined area, and, or while removing said masking means from said substrate.

2. A process as in claim 1 in which the coating material is embrittled at a temperature of < 25° C to ≥ −196° C.

3. A process as in claim 2 in which said masking means comprises a cold sink.

4. A process as in claim 3 in which said masking means comprises metal foil.

5. A process as in claim 4 in which said metal is aluminum.

6. A process as in claim 2 in which said coating material comprises para-xylylene polymer.

7. A process as in claim 6 in which said coating material comprises poly-chloro-para-xylylene.

8. A process as in claim 6 in which said coating material is applied so as to provide a coating on the unmasked area of the substrate which is about 2 to 30 microns thick.

9. A process for masking a defined area on a substrate during the coating of such substrate with a coating material which suffers a loss, at a temperature of < 25° to ≥ −196° C., for about ≥ 125% of the elongation value it possesses at 25° C., and which can be embrittled so as to prevent the coating of said defined area with said coating material, which comprises:

masking said defined area with cold sink masking means, applying said coating material to said substrate so as to continuously coat the masked and unmasked areas thereof, cooling said cold sink masking means and the coating material thereon to a temperature and for a period of time as is sufficient to embrittle such coating material, tearing the embrittled coating material from said defined area, and, or while, removing said cold sink masking means from said substrate.

10. A process as in claim 9 in which said cold sink masking means comprises metal foil.

11. A process as in claim 10 in which said metal is aluminum.

12. A process as in claim 9 in which said coating material comprises para-xylylene polymer.

13. A process as in claim 12 in which said coating material comprises poly-chloro-para-xylylene.

14. A process as in claim 12 in which said coating material is applied so as to provide a coating on the unmasked area of the substrate which is about 2 to 30 microns thick.

15. A process as in claim 12 in which the coating material is embrittled at a temperature of < 25° C. to ≥ −196° C.

16. A process for masking a defined area on a substrate during the coating of such substrate with paraxylylene polymer so as to prevent the coating of said defined area with said polymer, said defined area being less than the total coatable area of said substrate, which comprises:

masking said defined area with cold sink masking means, applying said polymer, in a vapor deposition coating process, as a continuous coating over the masked and unmasked areas of said substrate, cooling said cold sink masking means and the polymer thereon to a temperature and for a period of time as is sufficient to embrittle such polymer, tearing the embrittled polymer from said defined area, and, or while, removing said cold sink masking means from said substrate.

17. A process as in claim 16 in which said para-xylylene polymer comprises poly-chloro-para-xylylene.

18. A process as in claim 17 in which said polymer is embrittled at a temperature of about −80° C.

19. A process as in claim 18 in which said cold sink masking means comprises metal foil.

20. A process as in claim 19 in which said metal is aluminum.

21. A process as in claim 16 in which said polymer is applied so as to provide a coating on the unmasked area of the substrate which is about 2 to 30 microns thick.

* * * * *